Figure 1:
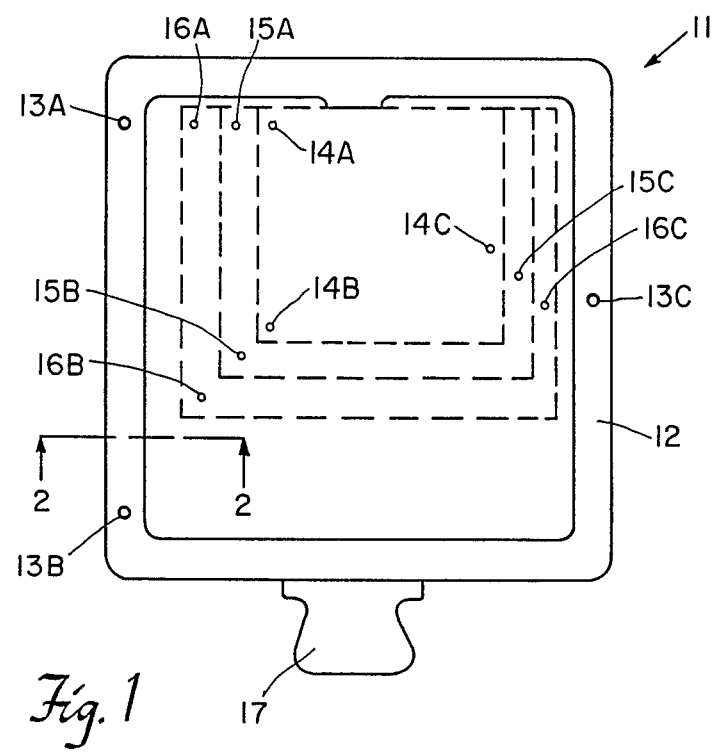

United States Patent [19]

Guarino

[11] Patent Number: 4,711,438

[45] Date of Patent: Dec. 8, 1987

[54] MASK HOLDING

[75] Inventor: Nicholas Guarino, Arlington, Mass.

[73] Assignee: Micrion Limited Partnership, Beverly, Mass.

[21] Appl. No.: 861,132

[22] Filed: May 8, 1986

[51] Int. Cl.[4] .............................................. B25B 1/00
[52] U.S. Cl. ................................... 269/152; 269/303; 269/307; 269/249; 269/254 CS
[58] Field of Search ............. 269/900, 254 R, 254 CS, 269/249, 303, 315, 152, 104, 307; 219/158–161, 121 EB, 121 EE; 118/500

[56] References Cited

U.S. PATENT DOCUMENTS

| 106,080 | 8/1870 | Saurmon | 269/254 CS |
|---|---|---|---|
| 2,867,003 | 1/1959 | Stiles | 269/249 |
| 3,484,896 | 12/1969 | Greenman | 269/254 CS |
| 4,288,065 | 9/1981 | Braverman | 269/900 |
| 4,593,804 | 6/1986 | Kinsey et al. | 269/900 |

FOREIGN PATENT DOCUMENTS

| 57-73936 | 5/1982 | Japan | 269/254 CS |
|---|---|---|---|
| 57-96527 | 6/1982 | Japan | 269/254 CS |

*Primary Examiner*—Robert C. Watson
*Attorney, Agent, or Firm*—Charles Hieken

[57] ABSTRACT

A rectangular plate holder is formed with an approximately square recess defined by an upstanding perimetrical wall having two top studs on one side and one top stud on an opposed side wall lapped to be coplanar in a common plane. The base plates include five and three sets of mask clamping points for defining clamping points for five and three mask sizes. Each clamp includes a clamp assembly fastened to the base having a spring-loaded lower clamping arm below an upper set screw clamping point. A handle is fixed to one side between the opposed sides having the lapped studs.

2 Claims, 2 Drawing Figures

MASK HOLDING

The present invention relates in general to mask holding and more particularly concerns novel apparatus and techniques for holding masks or other substrates for processing, such as by a focused ion beam. The invention is especially useful for precisely positioning a mask or other item to be processed. The invention also facilitates accommodating a range of masks of different sizes while providing the desired precise positioning.

A controlled ion beam system enables precise operations on small integrated circuits or masks for making them. It is important to precisely position the mask or substrate to be processed. It is a problem to admit the mask or substrate to be processed into an evacuable chamber in a manner that facilitates precise positioning.

Accordingly, it is an important object of this invention to provide improved apparatus and techniques for holding a mask or substrate to be processed.

According to the invention, there is plate holder means having a wall around its perimeter carrying means defining registration points, a plurality of clamping means affixed to the base of the holding means, each having means for adjustably supporting an edge of a mask or substrate to be processed so that the clamping means may be adjusted to align the front of the mask or substrate in registration with the registration points. Preferably, there are three reference points and three clamping points for each mask. Preferably, the clamping means comprises a spring-loaded lower clamp arm and an upper set screw that allows the height of the clamped mask or substrate to be adjusted.

Figure 2:
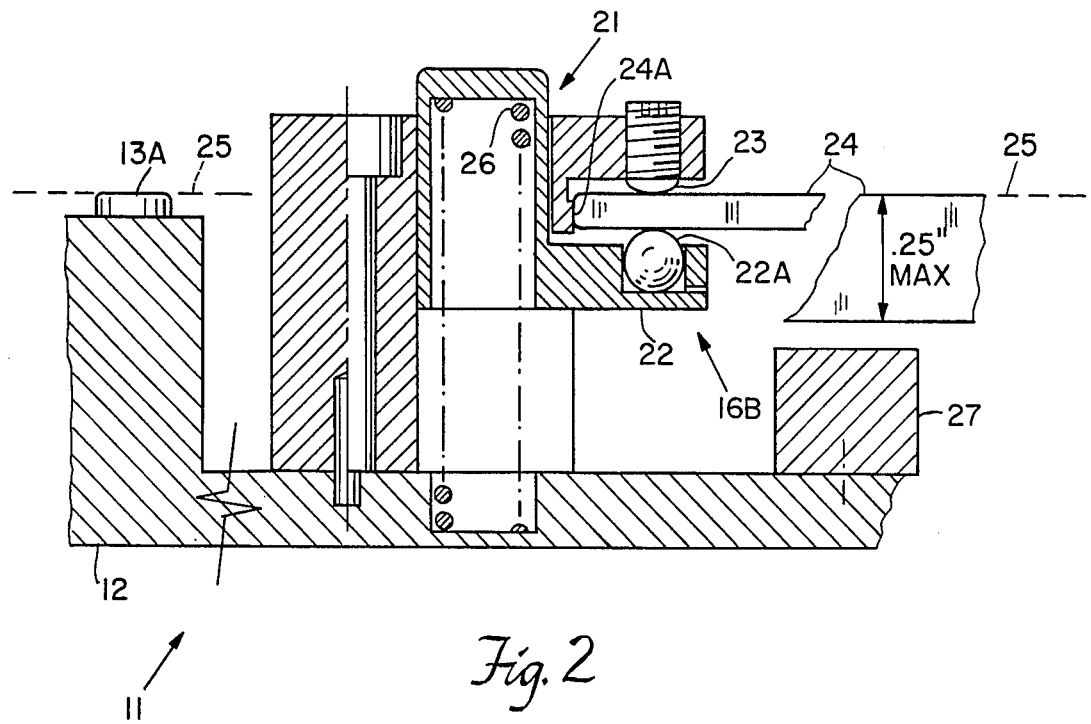

Numerous other features, objects and advantages of the invention will become apparent from the following specification when read in connection with the accompanying drawing in which:

FIG. 1 is a plan view of an embodiment of the invention with clamps removed to show preferred clamping points; and FIG. 2 is a fragmentary sectional view through section 2—2 of FIG. 1 with a clamp in position and a fragment of a mask clamped in place.

With reference now to the drawing and more particularly FIG. 1 thereof, there is shown a top plan view of a plate holder according to the invention free of clamps and masks or substrates. Plate holder, or cassette, 11 is formed with an upstanding perimetrical wall 12 having studs 13A, 13B and 13C defining registration points. The well inside wall 12 may accommodate masks of a number of different sizes. There is a set of three clamping points for each size mask. A first set of points 14A, 14B and 14C define clamping points for a smallest mask, points 15A, 15B and 15C for a second mask and 16A, 16B and 16C for a third mask. A fourth mask may be seated in the recess surrounded by wall 12. With this arrangement square mask plates of 4, 5, 6 and 7 inches may be accommodated on a single plate holder, and square mask plates of 3¼, 4½ and 5½ inches together with those 3"×5" may be accommodated on another plate holder.

At least one of the studs is separated from at least one other of the studs by the well or recess inside wall 12. Thus, stud 13C is separated from both studs 13A and 13B by this recess. Similarly, at least one of the three clamping points in a set is separated from at least one other of the three clamping points in that set by a region in the well or recess for accommodating a mask or substrate to be processed. Thus, clamping point 14C is separated by such a region from both clamping points 14A and 14B.

Referring to FIG. 2, there is shown a partial sectional view of the mask holder through section 2—2 of FIG. 1 with a clamp present at point 16B to illustrate a preferred form of clamp and the means for aligning the front of a mask with the surface defined by registration points 13A, 13B and 13C. Clamp 21 is anchored to the bottom of plate holder 11 and includes a lower spring-loaded clamp element 22 below an upper set screw element 23 that coact to define clamping point 16B and snugly engage mask plate 24 whose edge abuts clamping element 21. Set screw 23 is adjusted so that the front or top surface of mask plate 24, which typically may be up to ¼-inch thick, coincides with the top surface of stud 13A represented by dotted line 25. A coil spring 26 urges lower clamping element 22 upward against the rear or bottom of mask plate 24 as shown. Similar clamping occurs at the other two clamping points 16A and 16C to snugly engage the mask to be processed aligned at the proper height for facilitating processing with an ion beam. With the mask thus positioned, handle 17 may be grasped to place the plate holder with the mask clamped into position into the loading chamber of an ion beam processing system.

As indicated above, three registration tabs are used to position and clamp the mask plate 24 in place. The front or top surface of mask plate 24 must be coplanar with plane 25 defined by the three registration points 13A, 13B and 13C. These three buttons or studs are lapped to obtain uniformity over their individual surfaces, typically 3/16" in diameter, and the overall flatness tolerance for plane 25 defined by these three lapped surfaces is typically ±0.00005 inch, or 1.25 micrometers. Such tolerances are consistent with the requirements of the technology of focused ion or electron beams in order to assure that the mask plate front surface is accurately and precisely held in the focal plane of the focused beam. Allowable overall tolerance errors in placing the mask in the focal plane are typically about ±10 to 20 micrometers. A major uncontrollable source of flatness error is the mask plate itself which, owing to its thickness (ranging typically from 1/16" to ¼"), can be 3 to 5 micrometers from perfect flatness. Therefore, it is important to hold the mask plate precisely positioned to minimize any further errors.

As indicated above each mask is held at three locations by three registration tabs of the type shown in FIG. 2. Each clamp or tab 21 includes a lower spring-loaded clamp element 22 below a fine-thread set screw 23 which permits adjusting the front surface of mask 24 to be coplanar with registration buttons 13A, 13B and 13C in plane 25. The set screws 23 may be locked in place by medium-grade Loc-tite after the adjustment is made. The adjustment may be made on a surface plate using standard precision indicators. Distortion of a mask 24 of glass is avoided from the practical standpoint by having the contacting points of the oval-tipped set screw 23 and ball 22A aligned as shown with the axis of set screw 23 passing through the center of ball 22A. Misalignment of these points would produce a moment in the mask and create bending effects which would make the mask plate distort like a potato chip. Insertion of mask plate 24 is easily accomplished by depressing the three spring clamps, such as 22, and sliding mask plate 24 in on two plastic slide strips, such as 27.

Photomasks used by the semiconductor industry contain the circuit patterns which are optically transferred to silicon wafers for producing integrated circuits. The microscopic patterns on the photomask may be generated by optical methods, in which a vacuum environment is not needed, or by electron or ion beam methods, in which a vacuum environment is needed. The cassette (or plate holder) described herein is a mechanical structure which may be used for holding the photomasks. There are a variety of photomasks sizes available to the industry, ranging from masks having a maximum dimension of two inches up to nine inches. Most masks have a maximum dimension from four inches to seven inches.

Placing a mask plate in a vacuum environment (about $10^{-7}$ Torr) for circuit pattern generation (lithography) or for repair of pattern defects involves different design approaches than working with them in air with optical type machines. For example, immediate access to that portion of an optical machine which holds the mask plate is available to an operator for changing its size handling capacity. However, in a beam-type machine such access is impractical owing to the vacuum environment. For example, venting the machine to atmospheric pressure, removing a portion of the vacuum enclosure structure, changing its size-handling feature, then reclosing and reproducing the required operating vacuum involves several hours of down time. A typical prior art approach for avoiding this unacceptable down time has been to provide a holder for each mask plate of fixed size. The size handling capability within the vacuum environment remained fixed, and it was possible to maintain a continuous vacuum.

An important feature of the present invention is the ability to accommodate a number of different plate sizes on a single cassette. This advantage is achieved by providing hole patterns for positioning a set of three registration tabs for the desired size. This versatility is of particular economical advantage when plates of a variety of sizes are being processed, a commmon occurrence in experimental programs.

The invention has a number of advantages. It enables masks or substrates of a range of sizes to be precisely positioned in a holder that itself may be precisly positioned to facilitate processing the plate or substrate at the exact desired location. It is relatively easy and inexpensive to manufacture and fabricate. It is relatively easy to insert and remove mask plates and substrates. It is relatively easy to insert and remove the plate holder.

It is evident that those skilled in the art may now make numerous uses and modifications of and departures from the specific apparatus and techniques herein disclosed without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. A holder for a mask or substrate to be processed by a particle beam comprising, a plate holder having a base and an upstanding perimetrical wall to define a recess for accommodating masks or substrates to be processed, said wall having three spaced studs each having a top surface in a common plane parallel to said base with at least one of said studs separated from at least one other of said studs by said recess, means defining at least one set of three clamping points on said base with at least one of said three clamping points separated from at least one other of said three clamping points by a region in said recess for accommodating a mask or substrate to be processed, and clamping means at each of said clamping points for clamping the edges of a mask or substrate to be processed, said clamping means having means for selectively adjusting the position of the mask or substrate to be processed so that the surface thereof away from said base coincides with said common plane.

2. A plate holder in accordance with claim 1 wherein said clamping means comprises, a clamping member having a spring-loaded bottom clamp element and a set screw top element for engaging therebetween a mask of substrate to be processed and adjusting the position thereof so that the surface thereof away from said base coincides with said common plane.

* * * * *